US008890556B2

(12) United States Patent
Chen et al.

(10) Patent No.: US 8,890,556 B2
(45) Date of Patent: Nov. 18, 2014

(54) REAL-TIME ON-CHIP EM PERFORMANCE MONITORING

(75) Inventors: Fen Chen, Williston, VT (US); Roger A. Dufresne, Essex Junction, VT (US); Kai D. Feng, Hopewell Junction, NY (US); Richard J. St-Pierre, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 512 days.

(21) Appl. No.: 13/282,090

(22) Filed: Oct. 26, 2011

(65) Prior Publication Data

US 2013/0106452 A1    May 2, 2013

(51) Int. Cl.
*G01R 31/3187* (2006.01)
*G01R 31/30* (2006.01)

(52) U.S. Cl.
CPC .................................. *G01R 31/3004* (2013.01)
USPC .................................................... 324/750.03

(58) Field of Classification Search
None
See application file for complete search history.

(56) References Cited

U.S. PATENT DOCUMENTS

| | | | |
|---|---|---|---|
| 4,739,258 A | 4/1988 | Schwarz | |
| 5,053,700 A | 10/1991 | Parrish | |
| 5,264,377 A * | 11/1993 | Chesire et al. | 438/11 |
| 5,485,095 A | 1/1996 | Bertsch et al. | |
| 5,497,076 A | 3/1996 | Kuo et al. | |
| 5,514,974 A | 5/1996 | Bouldin | |
| 5,627,101 A | 5/1997 | Lin et al. | |
| 6,037,795 A | 3/2000 | Filippi et al. | |
| 6,136,619 A | 10/2000 | Ceuninck et al. | |
| 6,614,251 B2 | 9/2003 | Ootsuji | |
| 6,683,465 B2 | 1/2004 | Fetterman et al. | |
| 6,724,214 B2 | 4/2004 | Manna et al. | |
| 7,102,445 B2 | 9/2006 | Yamazaki et al. | |
| 7,339,390 B2 * | 3/2008 | Cranford et al. | 324/750.3 |
| 7,394,273 B2 * | 7/2008 | Hsu et al. | 324/750.3 |
| 7,521,952 B2 | 4/2009 | Chanda et al. | |
| 7,683,651 B2 | 3/2010 | Chanda et al. | |
| 7,719,302 B2 | 5/2010 | Hsu et al. | |
| 8,237,458 B2 * | 8/2012 | Federspiel | 324/713 |
| 8,253,423 B2 | 8/2012 | Lee et al. | |
| 2008/0217614 A1 * | 9/2008 | Cranford et al. | 257/48 |

FOREIGN PATENT DOCUMENTS

JP    58182237    10/1983

OTHER PUBLICATIONS

U.S. Appl. No. 13/222,306, Office Action, May 6, 2014, 13 pages.

* cited by examiner

*Primary Examiner* — Vinh Nguyen (74) *Attorney, Agent, or Firm* — David A. Cain; Hoffman Warnick LLC (57) ABSTRACT

An integrated circuit, testing structure, and method for monitoring electro-migration (EM) performance. A method is described that includes method for measuring on-chip electro-migration (EM) performance, including: providing a first on-chip sensor continuously powered with a stress current; providing a second on-chip sensor that is powered only during measurement cycles with a nominal current; obtaining a first resistance measurement from the first on-chip sensor and a second resistance measurement from the second on-chip sensor during each of a series of measurement cycles; and processing the first and second resistance measurements.

19 Claims, 6 Drawing Sheets

REAL-TIME ON-CHIP EM PERFORMANCE MONITORING

BACKGROUND

The present invention relates to a measurement structure in a standard cell for controlling and monitoring process parameters for electro-migration (EM) performance during the operational lifetime of an integrated circuit (IC).

Electro-migration (EM) refers to mass transport due to the momentum exchange between conducting electrons and diffusing metal atoms in metallic interconnects. As integrated circuits become progressively more complex, the individual components must become increasingly more reliable if the reliability of the whole device is to be acceptable. However, due to continuing miniaturization of very large scale integrated (VLSI) circuits, thin film metallic conductors or interconnects are subject to increasingly high current densities. Under these conditions, EM can lead to an electrical failure of a product within a relatively short time, therefore reducing the product lifetime to an unacceptable level. More and more integrated circuit systems, especially for those circuits used in medical, military, and space applications, need an assurance of system reliability for their critical missions. Therefore, it is of great importance and critical need to evaluate EM performance during the operational lifetime of the IC to assure overall chip reliability.

EM reliability tests during integrated circuit (IC) manufacturing attempt to project future EM failures, i.e., the tests calculate "EM projections". Unfortunately, reliability of the tests is limited due to the approach used in conventional testing. For example, such tests are performed at extremely high temperatures (e.g., 300-400 degrees Celsius) in order to accelerate failure times of a very limited sample size (e.g., less than 100 samples per condition) at module level. Drawbacks of this approach include:

1) High temperatures could cause some competing degradation effects such as stress migration and low-k film material degradation;

2) Module (i.e., package) level test is costly as it requires, e.g., extra shipping, wafer dicing, cleaning, chiplet picking, wire bonding, baking, etc.; module level testing is also time consuming and prone to other damages, e.g., ESD, cracking, edge seal damages, etc.;

3) Modeling chip level EM from line level is not easy and needs a careful mathematical transformation (chip level EM is not Lognormal distributed); and 4) Confidence bounds of projection based on limited sample size are typically poor and multi-modal sub-group distributions cannot be easily separated from a limited sample size.

Monitoring EM performance in real-time during actual chip operation is even more challenging, and thus far has not been proposed.

BRIEF SUMMARY

In a first aspect, the present invention provides a method for measuring on-chip electro-migration (EM) performance, comprising: providing a first on-chip sensor continuously powered with a stress current; providing a second on-chip sensor that is powered only during measurement cycles with a nominal current; obtaining a first resistance measurement from the first on-chip sensor and a second resistance measurement from the second on-chip sensor during each of a series of measurement cycles; and processing the first and second resistance measurements.

In a second aspect, the invention provides a integrated circuit (IC) having facilities for measuring on-chip electro-migration (EM) performance, comprising: a plurality of EM measurement circuits, each EM measurement circuit comprising: a first subcircuit having a first on-chip sensor continuously powered with a stress current; a second subcircuit having a second on-chip sensor that is powered only during measurement cycles with a nominal current; and a set of control switches that, during a measurement cycle, activates the second subcircuit and outputs a first and a second voltage measurement from both the first and second subcircuits, respectively.

In a third aspect, the invention provides a electro-migration (EM) measurement circuit embeddable in an IC chip to evaluate on-chip EM performance, comprising: a first subcircuit having a first on-chip sensor continuously powered with a stress current; a second subcircuit having a second on-chip sensor that is powered only during measurement cycles with a nominal current; and a set of control switches that, during a measurement cycle, completes the second subcircuit and outputs a first and a second voltage measurement from both the first and second subcircuits, respectively.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings.

The drawings are merely schematic representations, not intended to portray specific parameters of the invention. The drawings are intended to depict only typical embodiments of the invention, and therefore should not be considered as limiting the scope of the invention. In the drawings, like reference numbering represents like elements.

DETAILED DESCRIPTION

Figure 1:
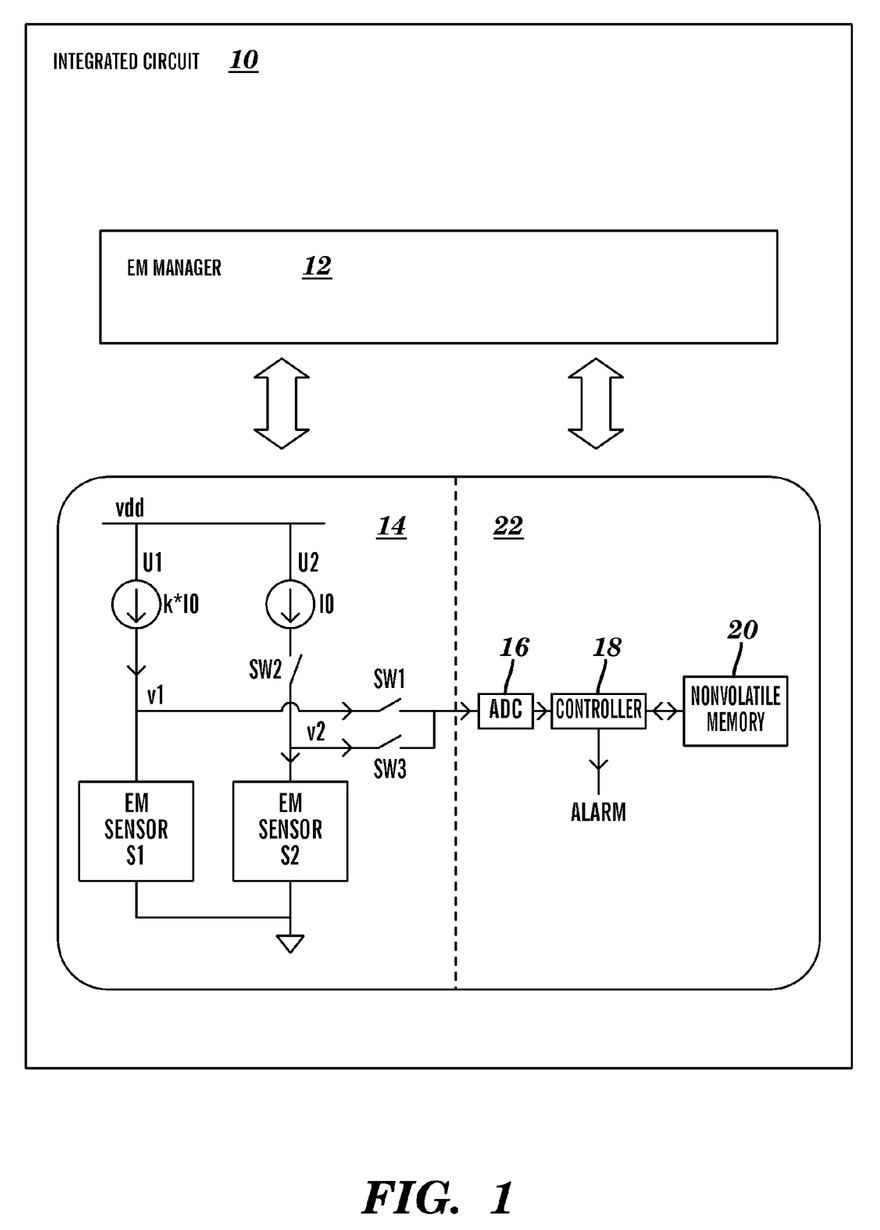
FIG. 1 depicts an integrated circuit (IC) having EM measurement circuit resistors in accordance with an embodiment of the present invention.

The following embodiments include testing structures and methods for obtaining EM performance for an integrated circuit (IC) "on-chip," i.e., in real-time during actual IC chip operations. FIG. 1 depicts an IC 10 that may comprise any type of integrated circuit device and which further includes functionality for evaluating on-chip EM performance throughout the IC 10. IC 10 generally includes an EM manager 12, a plurality of EM measurement circuits 14, and a set of control elements 22.

EM manager 12 provides any necessary control operations associated with the obtaining EM performance. EM manager 12 may for example be responsible for scheduling and controlling test cycles for the plurality of measurement circuits 14, collecting and managing results, outputting alarms and/or reports, etc. EM manager 12 may be implemented in any manner, e.g., with a processor, specialized hardware, firmware, etc., and may be partially or fully implemented externally to the IC 10. EM manager 12 may for example be responsible for controlling switches SW1, SW2 and SW3 in each EM measurement circuit 14.

EM measurement circuits 14 are utilized to obtain EM related data from the IC 10. EM measurement circuits 14 may be placed throughout the IC 10 whereever EM performance testing is desired. Any number of EM measurement circuits 14 may be implemented, e.g., a million or more. The operation of EM measurement circuit 14 is described below.

Control elements 22 process data collected from the EM measurement circuit 14. In the embodiment shown in FIG. 1, control elements 22 include an analog-to-digital converter (ADC) 16, a controller 18, and non-volatile memory 20, each of which may be implemented in any known manner. In an illustrative embodiment, one or more of the control elements 22 may be integrated into the EM manager 12 to process data collected from each of the EM measurement circuits 14. Alternatively, control elements 22 may be implemented to handle a single EM measurement circuit 14, or a subset of EM measurement circuits 14.

Each EM measurement circuit 14 includes two identical EM sensors S1 and S2 implemented on two proximately located and parallel subcircuits. A first subcircuit containing the first EM sensor S1 operates in a continuous manner with an intensive stress current (e.g., k*I0 amps, where k>1) that is powered by a first current source U1. The first subcircuit has voltage v1 determined as v1=(k*I0)*$R_{S1}$, with the associated resistance determined as $R_{S1}$=v1/(k*I0). A line for outputting voltage v1 of the first subcircuit to ADC 15 is controlled by a first switch SW1.

The second subcircuit containing the second EM sensor S2 is not powered on except during measurement cycles, and is only powered with a nominal operating current (e.g., I0 amps) by current source U2. As such, because the second EM sensor S2 is (1) only powered on as needed; and (2) only receives a nominal current, EM sensor S2 is maintained at the initial reliability status. Accordingly, to activate and obtain voltage data v2 from the second subcircuit, switches SW2 and SW3 must be activated. When switch SW2 is closed, the subcircuit is activated and voltage v2 in the second subcircuit is provided as v2=I0*$R_{S2}$, with an associated resistance $R_{S2}$=v2/I0. Switch SW3 activates the output line containing voltage v2 to ADC 16.

EM measurement circuit 14 generally operates by measuring/collecting the voltages v1 and v2 from each subcircuit during each of a series of monitoring cycle. The associated resistances $R_{S1}$ and $R_{S2}$ are calculated for each cycle and the difference (i.e., delta) between the two is stored for each cycle. The deltas associated with each cycle can then be analyzed to evaluate EM performance. Because the first subcircuit is continuously powered at an intensive stress current, the resistance $R_{S1}$ provides a measure of EM performance. As the resistance increases over the chip's lifetime, EM performance decreases. Conversely, the resistance measure $R_{S2}$ obtained from the second subcircuit should remain relatively stable throughout the chip's lifetime since the circuit is only turned on during testing at the nominal current. The delta value thus provides an EM performance measure at the present measurement cycle. Analyzing the delta value relative to previously obtained delta values helps determine whether the performance is degrading over time. For the purposes of this disclosure, EM performance degradation over time is referred to herein as acceleration.

An illustrative methodology is as follows:
(1) SW1 is opened, SW2 is closed, U2 supplies I0 to sensor S2.
(2) SW3 is closed, ADC 16 converts v2 to digital data and controller 18 captures the data.
(3) SW1 is closed and SW3 and SW2 are opened, ADC 16 converts v1 to digital data and controller 18 captures the data.
(4) Controller 18 calculates $R_{S1}$, $R_{S2}$ and delta of R, then saves the delta in the non-volatile memory 20.
(5) Controller 18 compares the delta of a current cycle and one or more previous cycles and obtains the "acceleration."
(6) Based on the acceleration, controller 18 makes the following determinations:
  (a) when to schedule a next measurement,
  (b) if an alarm should be issued, and if yes, what level of the alarm, and
  (c) a prediction of remaining life time.

Each of the above determinations may be calculated in any manner. For instance, the amount of time between measurements may be inversely proportional to the amount of acceleration, e.g., the greater the acceleration, the less the time between measurements. Issuing an alarm can be based on threshold values V, e.g.,
  $V_1$<acceleration<$V_2$, then issue low level alarm;
  $V_2$<acceleration<$V_3$, then issue medium level alarm;
  V3<acceleration, then issue high level alarm.
Remaining lifetime can be determined, e.g., based on a knowledgebase of how acceleration correlates with failures. For instance, based on historical data, it may be known that an acceleration of x generally correlates with a remaining lifetime of y. Accordingly, remaining lifetime may be calculated based on a formula or obtained from a look-up table.

The resistance of the two EM sensors S1, S2 is determined substantially at the same time during each monitoring cycle, with resistance $R_{S2}$ of the second EM sensor S2 being used as a reference resistance. The advantage of this approach is that there are no operating condition variations during a given test cycle, such as temperature variations that might occur over time, i.e., from cycle to cycle. When the IC 10 is first powered on, $R_{S1}$ and $R_{S2}$ are very close.

Figure 2:
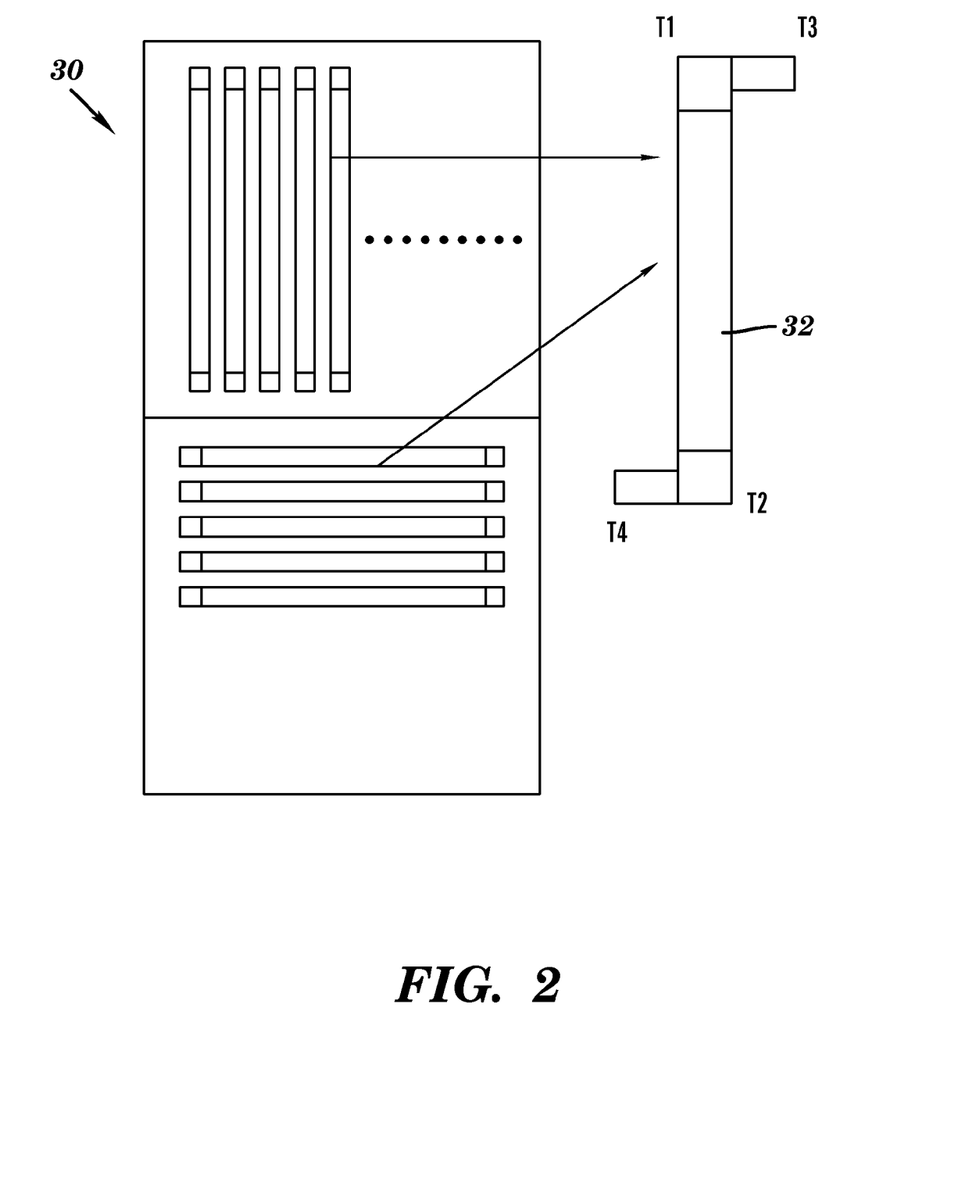
FIG. 2 depicts a layout view of four point resistors in accordance with an embodiment of the present invention.

The illustrative EM measurement circuit 14 may utilize a layout 30 of four point resistors 32 (also commonly referred to as "4-terminal resistors"), as shown in FIG. 2. Each resistor 32 includes an associated independent circuit to form an EM sensor 34. In an illustrative embodiment, one million or so such structures 34 may be utilized and packaged in a relatively small area, e.g., 1 mm$^2$.

Figure 3:
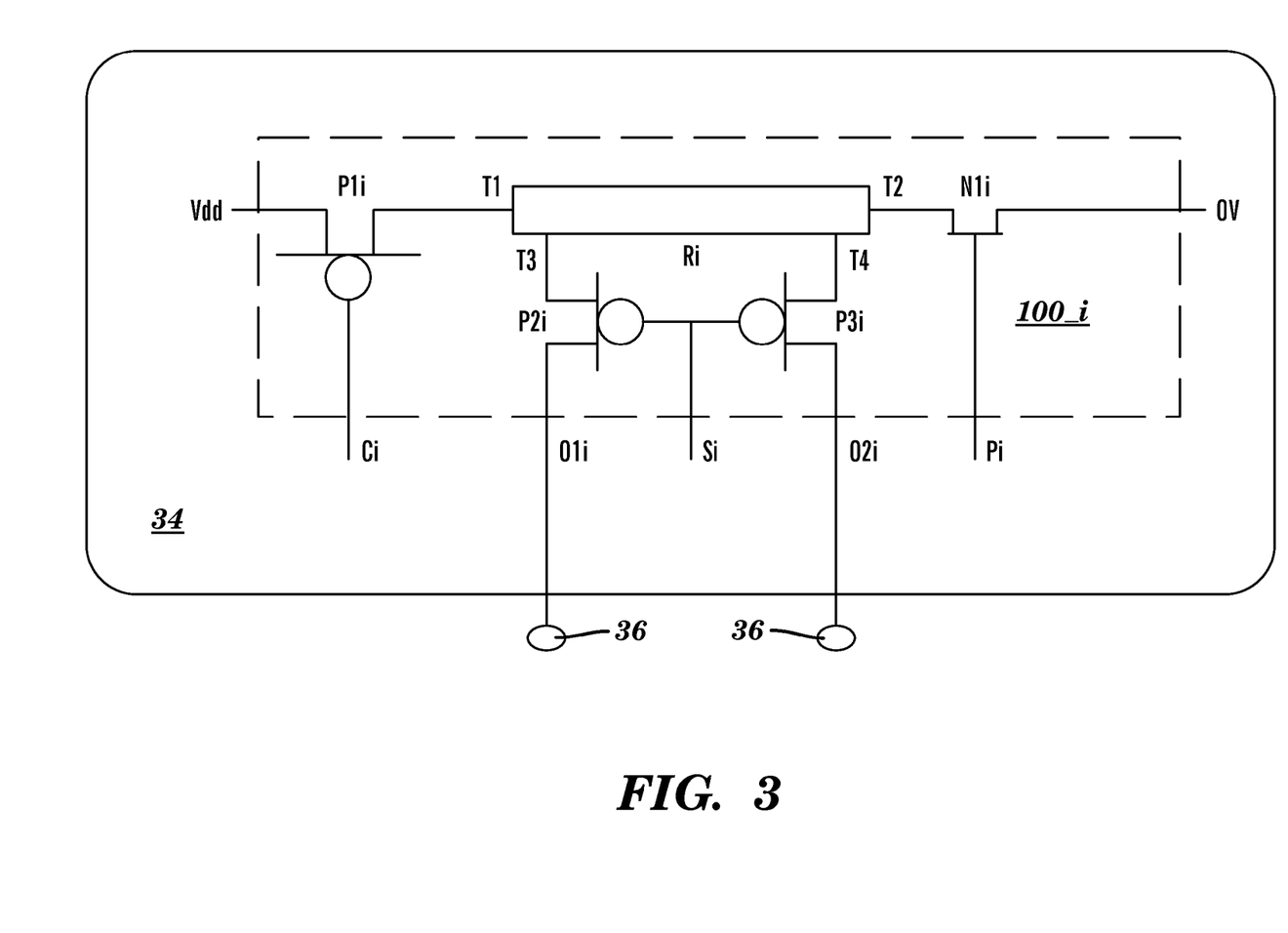
FIG. 3 depicts an EM testing structure in accordance with an embodiment of the present invention

FIG. 3 depicts an illustrative circuit for implementing EM sensor 34, which may be utilized for both sensors S1 and S2 shown in FIG. 1. In the illustrative EM sensor 34 shown in FIG. 3, resistor R1 includes terminals T1 and T2 that are used for current input and terminals T3 and T4 that are used for voltage measurement. A measurement switch comprising P2$i$ and P3$i$ is coupled to terminals T3 and T4. P1$i$ is a PFET (P-type field effect transistor) of the secondary side of a current mirror which provides the test current to resistor Ri. P2$i$ and P3$i$ are the switching PFETs and drains O1$i$ and O2$i$ of P2$i$ and P3$i$, respectively, are connected to two common voltage terminals 36, which can be used to measure the voltage cross the terminal T3 and terminal T4 of Ri. The gates of P2$i$ and P3$i$ are connected to the selection terminal, Si, and the sources are connected to terminals T3 and T4, respectively.

Referring to both FIGS. 1 and 3, NFET N1$i$ (FIG. 3) may be utilized to implement switch SW2 of EM sensor S2 (FIG. 1) to provide current I0 associated therewith. When is logic high is applied to the gate terminal Pi, the NFET N1$i$ is turned ON, and the current I0 passes through the resistor Ri. When a logic low is applied Pi, the NFET N1$i$ is turned OFF, and the current I0 is not passed through the resistor Ri.

When implementing EM sensor S1 (FIG. 1), terminal Pi should be supplied with a continuous logic high since the EM sensor S1 is required to have a continuous current k*I0. In order to provide the stress current k*I0 for EM sensor S1, the width of P1$i$ is set k times the width of the current for EM sensor S2. Thus, the configuration of sensor 34 in FIG. 3 may be used for both sensors S1 and S2 shown in FIG. 1.

When the voltage on Si is at logic low, both P2$i$ and P3$i$ are turned on so the voltage across terminals T3 and T4 of Ri are connected to the output voltage terminals 36 of the system. Note that while EM sensor 34 is shown implemented with PFETs, it is understood that the circuit could be implemented with any type or combination of transistors capable of performing the actions described herein, including PFETs, NFETs or bipolar transistors.

Figure 4:
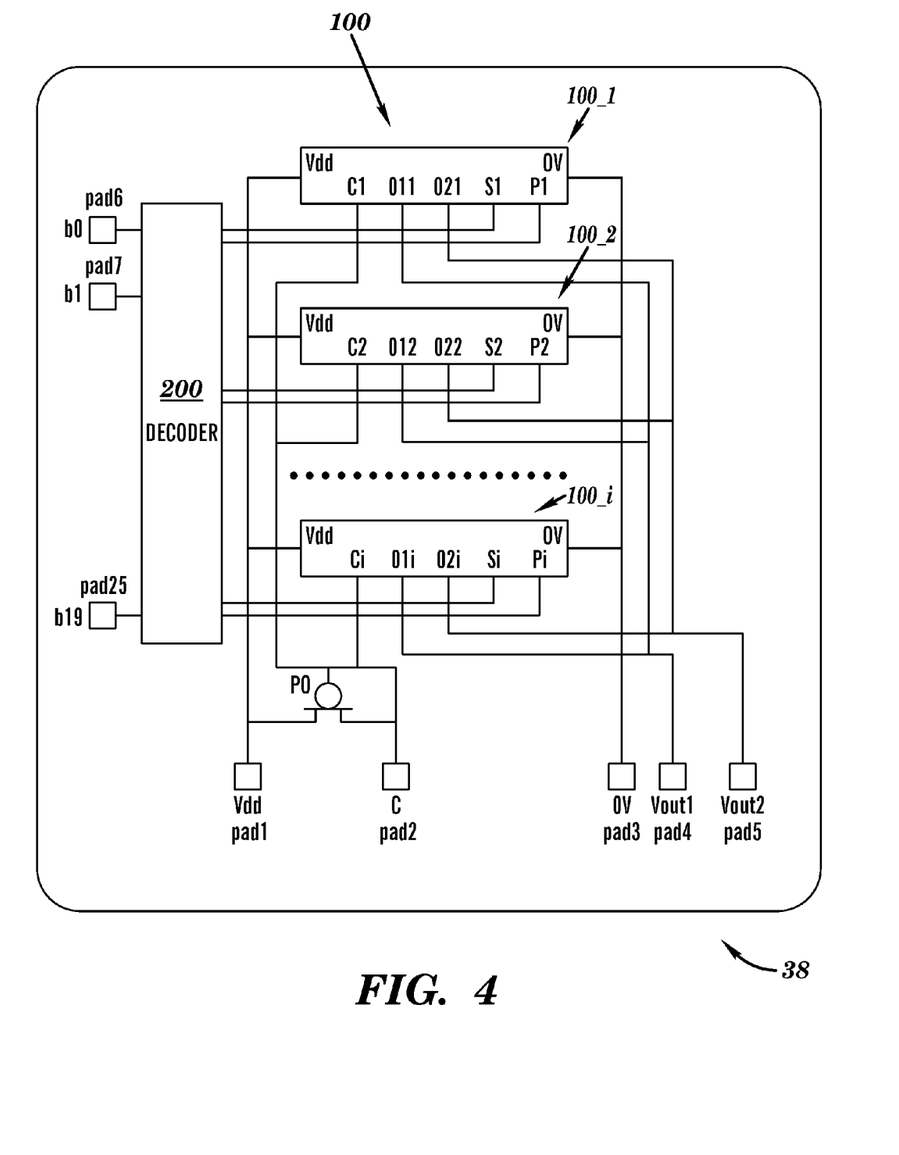
FIG. 4 depicts a testing array in accordance with an embodiment of the present invention.

FIG. 4 depicts an illustrative testing array 38 that comprises a plurality of EM sensors 100 (i.e., 100_1, 100_2 ... 100_$i$). The terminal Vdd of each testing structure 100 is connected to pad1. P0 is a PFET which forms the primary side of the current mirror for each EM sensor 100; the secondary side being provided, e.g., by P1$i$ shown in FIG. 3. The gate and drain of P0 are connected to pad2 and terminals C1, C2, ... Ci of each EM sensor 100. Pad2 is further connected to a current source so that the current mirror mirrors the current of the current source to each EM sensor 100 with a mirror ratio.

The terminal of 0V of each EM sensor 100 is connected to pad3. The terminal O1 (i.e., O11, O12 ... O1$i$) of each EM sensor 100 is connected to pad4, Vout1. The terminal of O2 (i.e., O21, O22 ... O2$i$) of each EM sensor 100 is connected to pad5, Vout2. Each terminal S (S1, S2 ... Si, P1, P2 ... Pi) is coupled to a decoder 200. The rest of the pads, i.e., pad6 to pad25 are utilized as the inputs of decoder, i.e., b0 to b19.

When a predetermined input code is applied to pads b0 to b19 of the decoder, one of the decoder outputs Si is set at logic low. For the tests of EM sensor S2 in FIG. 1, the decoder outputs Pi are at logic high at the same time. The signal Pi should not take the output line of the decoder, instead, a simple digital inverter can be used to generate Pi from Si. The output voltage of the corresponding EM sensor 100 on the resistor under test is connected to pad4 of Vout1 and pad5 of Vout2. Because this embodiment utilizes a 20 bit input into the decoder 200, up to 1,048,576 EM sensors 100 may be implemented to test the corresponding IC.

Figure 5:
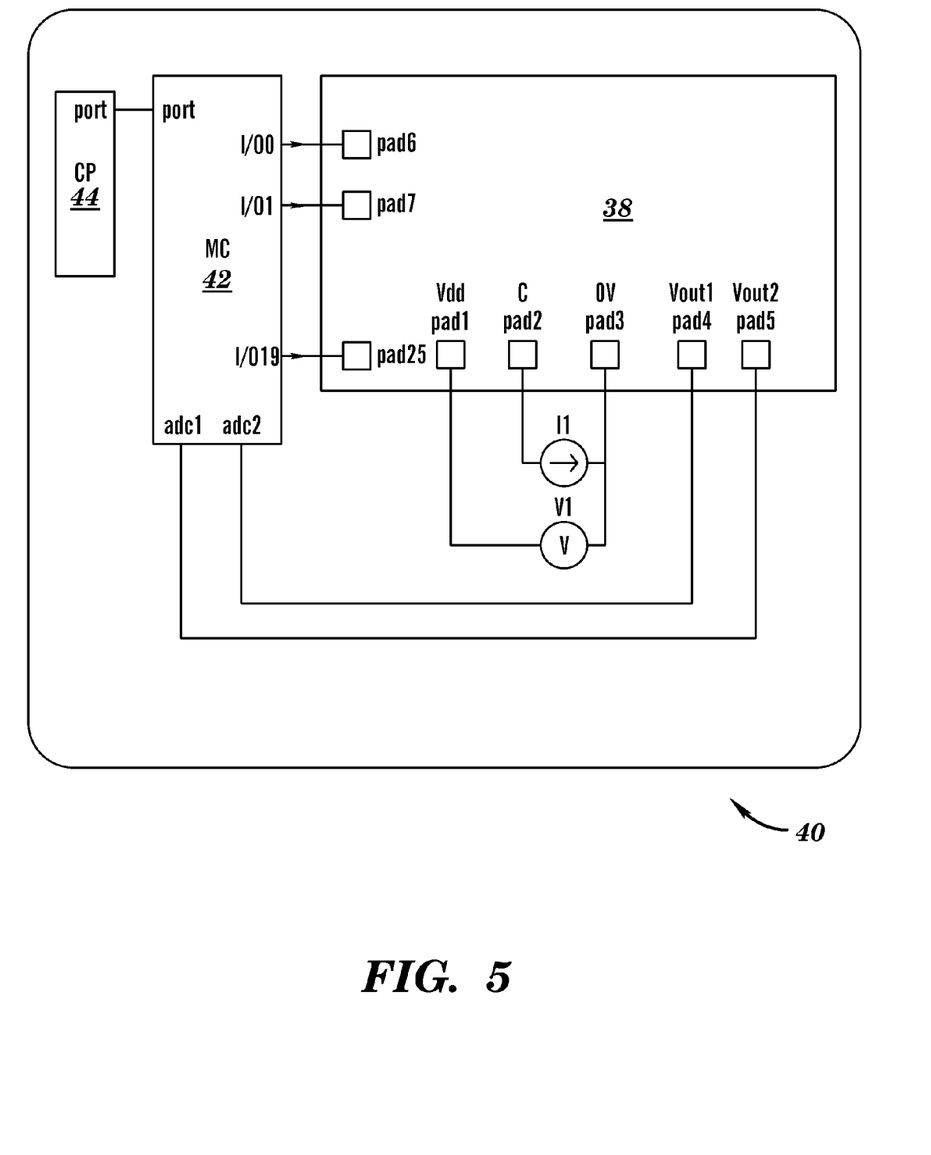
FIG. 5 depicts an externally controlled testing system in accordance with an embodiment of the present invention.

FIG. 5 depicts an illustrative on-chip array-based scanning system 40 for controlling the testing array 38 of FIG. 4. In this embodiment, testing array 38 is provided in which V1 is a voltage supply and I1 is a current source that provides the current to the current mirror. A microcontroller (MC) 42 is provided that includes two analog to digital converters (adc1 and adc2), and 20 input/output ports (I/O 0, I/O 1, ... I/O 19). A communication port, e.g., a USB, connects the microcontroller 42 to an eternal device such as a computer (CP) 44.

Figure 6:
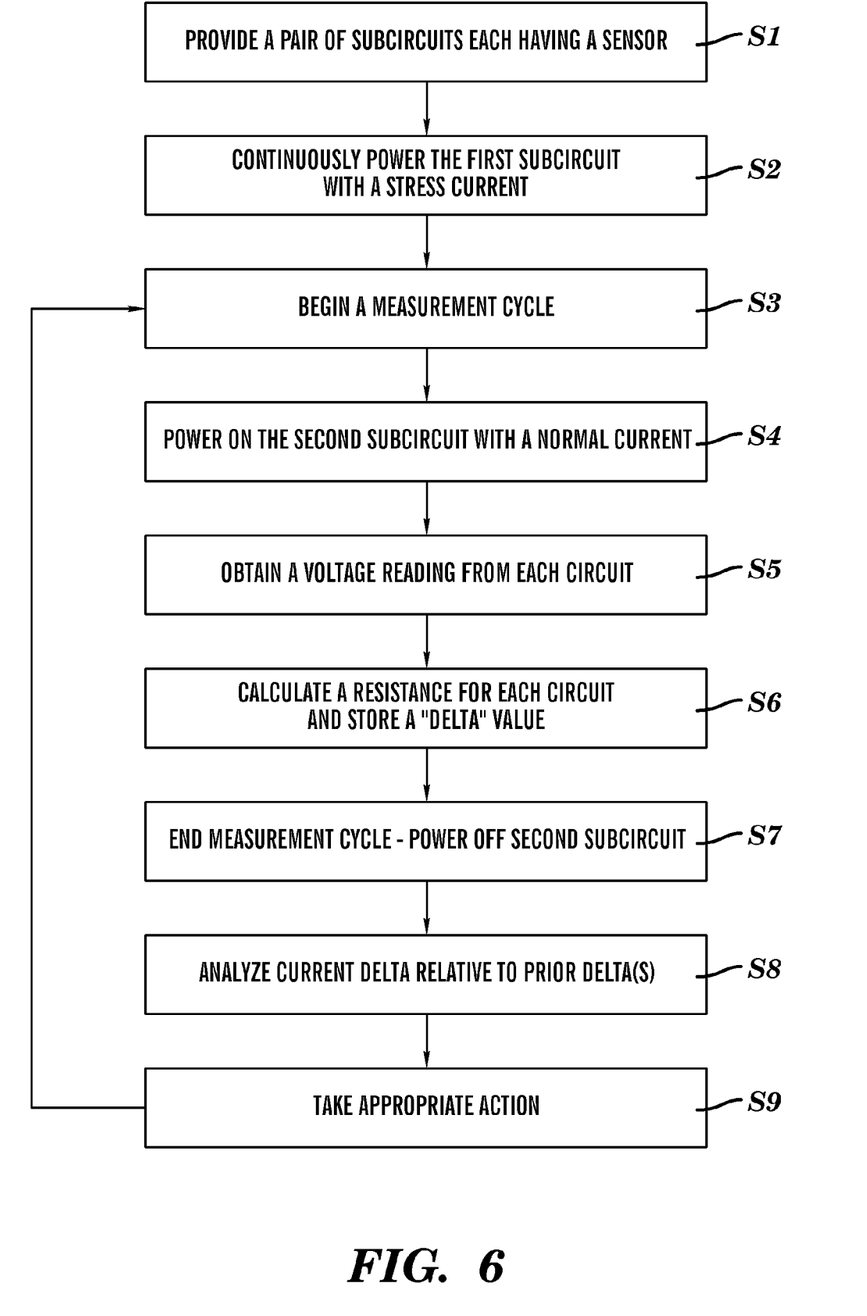
FIG. 6 depicts a flow diagram showing a methodology in accordance with an embodiment of the present invention.

FIG. 6 depicts a flow diagram showing an illustrative methodology. At S1, provide a pair of subcircuits within an IC each having a sensor and at S2, continuously power the first subcircuit with a stress current. At S3, begin a measurement cycle, including powering on the second subcircuit at a normal current at S4. Next at S5, obtain a voltage reading from each subcircuit and at S6 calculated a resistance for each circuit and store a delta value. At S7, end the measurement cycle and power off the second subcircuit. At S8, the current delta is analyzed relative to one or more prior deltas and an appropriate action is taken at S9. Illustrative actions include, generating an alarm, calculating a remaining lifetime, outputting results, storing results, scheduling a next measurement cycle, etc. A next measurement cycle is then repeated at S3.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "computer" or "system." Furthermore, aspects of the present invention may take the form of a netlist embodied and stored in an electronic storage medium and/or computer program product embodied in one or more computer readable medium(s) having computer readable program code embodied thereon.

What is claimed is:

1. A method for measuring on-chip electro-migration (EM) performance of an integrated circuit, comprising:
    providing a first on-chip sensor continuously powered with a first current;
    providing a second on-chip sensor that is powered only during measurement cycles with a second current, wherein the first current is greater than the second current;
    obtaining a first resistance measurement from the first on-chip sensor and a second resistance measurement from the second on-chip sensor during each of a series of measurement cycles; and
    processing the first and second resistance measurements to monitor the EM performance of the integrated circuit.

2. The method of claim 1, wherein obtaining the first and second resistance measurements includes:
    outputting a first voltage value from the first on-chip sensor and a second voltage value from the second on-chip sensor;
    converting each voltage value from analog to digital; and
    calculating a first resistance measurement and a second resistance measurement.

3. The method of claim 1, wherein processing the first and second resistance measurements includes:
    calculating a difference value between the first and second resistance measurements; and
    storing the difference value.

4. The method of claim 3, further comprising:
    evaluating a current calculated difference value relative to at least one prior stored difference value; and
    determining an acceleration indicative of EM performance.

5. The method of claim 4, further comprising:
    using the acceleration to perform at least one of: scheduling a next measurement cycle, issuing an alarm, and calculating a remaining lifetime of the integrated circuit.

6. The method of claim 1, wherein each on-chip sensor is implemented with an EM resistor.

7. The method of claim 6,
wherein the EM resistor comprises: a first terminal and a second terminal that provides a current input and a third terminal and a fourth terminal that provides a voltage measurement, the voltage measurement obtained from a pair of switching transistors whose gates are controlled by a selection switch and whose drains are utilized to measure a voltage across the third and fourth terminals; and wherein each on-chip sensor further includes a first transistor coupled to the first terminal of the EM resistor as a secondary side of a current mirror for supplying a test current; and wherein the second on-chip sensor includes a second transistor coupled to the second terminal of the EM resistor to provide a switch for selectively providing a current during measurement cycles.

8. An integrated circuit (IC) having facilities for measuring on-chip electro-migration (EM) performance of an integrated circuit, comprising:
a plurality of EM measurement circuits, each EM measurement circuit comprising:
a first subcircuit having a first on-chip sensor continuously powered with a first current;
a second subcircuit having a second on-chip sensor that is powered only during measurement cycles with a second current, wherein the first current is greater than the second current; and
a set of control switches that, during a measurement cycle, activates the second subcircuit and outputs a first and a second voltage measurement from both the first and second subcircuits, respectively.

9. The IC of claim 8, further comprising:
an analog-to-digital converter for converting the first and second voltage measurements to digital values; and
a controller for calculating a first resistance measurement and a second resistance measurement, and for calculating a difference value between the first resistance measurement and the second resistance measurement, and for storing the difference value in a memory.

10. The IC of claim 9, wherein the controller further evaluates a current calculated difference value relative to at least one prior stored difference value and determines an acceleration indicative of EM performance.

11. The IC of claim 10, wherein the controller utilizes the acceleration to perform at least one of: scheduling a next measurement cycle, issuing an alarm, and calculating a remaining lifetime of the integrated circuit.

12. The IC of claim 8, wherein each on-chip sensor is implemented with an EM resistor.

13. The IC of claim 12,
wherein the EM resistor comprises: a first terminal and a second terminal that provides a current input and a third terminal and a fourth terminal that provides a voltage measurement, the voltage measurement obtained from a pair of switching transistors whose gates are controlled by a selection switch and whose drains are utilized to measure a voltage across the third and fourth terminals; and wherein each on-chip sensor further includes a first transistor coupled to the first terminal of the EM resistor as a secondary side of a current mirror for supplying a test current; and wherein the second on-chip sensor includes a second transistor coupled to the second terminal of the EM resistor to provide a switch for selectively providing a current during measurement cycles.

14. An electro-migration (EM) measurement circuit embeddable in an IC chip to evaluate on-chip EM performance of an integrated circuit, comprising:
a first subcircuit having a first on-chip sensor continuously powered with a first current;
a second subcircuit having a second on-chip sensor that is powered only during measurement cycles with a second current, wherein the first current is greater than the second current; and
a set of control switches that, during a measurement cycle, completes the second subcircuit and outputs a first and a second voltage measurement from both the first and second subcircuits, respectively.

15. The EM measurement circuit of claim 14, further comprising:
an analog-to-digital converter for converting the first and second voltage measurements to digital values; and
a controller for calculating a first resistance measurement and a second resistance measurement, and for calculating a difference value between the first resistance measurement and the second resistance measurement, and for storing the difference value in a memory.

16. The EM measurement circuit of claim 15, wherein the controller evaluates a current calculated difference value relative to at least one prior stored difference value and determines an acceleration indicative of EM performance.

17. The EM measurement circuit of claim 16, wherein the controller utilizes the acceleration to perform at least one of: scheduling a next measurement cycle, issuing an alarm, and calculating a remaining lifetime of the integrated circuit.

18. The EM measurement circuit of claim 14, wherein each on-chip sensor is implemented with an EM resistor.

19. The EM measurement circuit of claim 18,
wherein the EM resistor comprises: a first terminal and a second terminal that provides a current input and a third terminal and a fourth terminal that provides a voltage measurement, the voltage measurement obtained from a pair of switching transistors whose gates are controlled by a selection switch and whose drains are utilized to measure a voltage across the third and fourth terminals; and wherein each on-chip sensor further includes a first transistor coupled to the first terminal of the EM resistor as a secondary side of a current mirror for supplying a test current; and wherein the second on-chip sensor includes a second transistor coupled to the second terminal of the EM resistor to provide a switch for selectively providing a current during measurement cycles.

* * * * *